United States Patent [19]

Talmy et al.

[11] Patent Number: 4,911,902

[45] Date of Patent: Mar. 27, 1990

[54] MULLITE WHISKER PREPARATION

[75] Inventors: Inna G. Talmy, Silver Spring, Md.; Deborah A. Haught, Reston, Va.

[73] Assignee: The United States of America as represented by the Secretary of the Navy, Washington, D.C.

[21] Appl. No.: 70,757

[22] Filed: Jul. 6, 1987

[51] Int. Cl.$^4$ ............................................. C01B 33/28
[52] U.S. Cl. ..................................... 423/328; 501/86; 501/128; 501/133; 501/153; 501/154
[58] Field of Search ................ 423/328; 501/128, 133, 501/153, 154, 86

[56] References Cited

PUBLICATIONS

Chemical Abstracts, vol. 61, p. 6620(g)–The Course of the Reaction of AlF$_3$ and SiO$_2$ in the Solid Phase–Bela Locsei.

Primary Examiner—Stephen J. Lechert, Jr.
Attorney, Agent, or Firm—Kenneth E. Walden; Roger D. Johnson

[57] ABSTRACT

A process for preparing mullite, 3Al$_2$O$_3$.2SiO$_2$, whiskers by
(1) forming an intimate, anhydrous mixture of AlF$_3$ and SiO$_2$ powders in about a 12:13 molar ratio;
(2) heating the mixture in an anhydrous, SiF$_4$ atmosphere at about 700° C. to about 950° C. to form barlike crystalline topaz, Al$_2$(SiO$_4$)F$_2$; and
(3) heating the barlike crystalline topaz under anhydrous conditions in a SiF$_4$ atmosphere at a temperature of from about 1150° C. to about 1400° C. to produce mullite whiskers.

The mullite whiskers produced can be used in ceramic and metal matrices without further chemical treatment.

11 Claims, 4 Drawing Sheets ns
MULLITE WHISKER PREPARATION

BACKGROUND OF THE INVENTION

This invention relates to mullite and more particularly to the preparation of mullite whiskers.

Various methods have been use to produce mullite whiskers.

U.S. Pat. No. 3,104,943, entitled "Spinnable Mullite Fibers and Their Preparation," which issued to Kenneth L. Berry on Sept. 24, 1963, discloses a method whereby mullite fibers are crystallized from a vapor phase derived from heating sources of Si, Al, $O_2$, and S in an atmosphere containing at least 1 percent $H_2$ at 800°–1200° C.

U.S. Pat. No. 3,607,025, entitled "Silica-Deficient Mullite Fiber and a Process for Its Production," which issued to Howard W. Jacobson on Sept. 21, 1971, discloses a process whereby an alkali halide and $AlCl_3$ are contacted with a silica source in the presence of an oxidizing gas at 1000°–1350° C. The fibers produced, however, are not stoichiometric mullite (72.8% $Al_2O_3$ and 28.2% $SiO_2$) b composition but do exhibit the x-ray pattern of compositional mullite. The fibers are silica deficient containing 82–99 percent by weight $Al_2O_3$ and the remainder $SiO_2$. Also in the process, the fibers must be leached out from a solidified melt with water or dilute acid solution.

U.S. Pat. No. 3,073,770, entitled "Mullite Synthesis," which issued to William R. Sinclair and John C. Williams on Jan. 15, 1963, discloses a process whereby a reaction sputtered film of $Al_2O_3$ and $SiO_2$ is heated to at least 1000° C. to form mullite whiskers.

Bella Locsei in "Mullite Formation in the Aluminum Fluoride-Silica System" ($AlF_3$-$SiO_2$), Nature, No. 4779, June 3, 1961, discloses that mullite can be formed from reagent grade aluminum fluoride ($AlF_3$) with or without structural water and silica gel or silica glass by heat treatment in an oxidizing atmosphere.

SUMMARY OF THE INVENTION

Accordingly, an object of this invention is to provide a new method of producing mullite whiskers.

Another object of this invention is to provide a method of producing high purity stoichiometric mullite whiskers.

A further object of this invention is to provide a simpler, less expensive method of producing high purity stoichiometric mullite whiskers.

These and other objects of this invention are accomplished by providing a method of producing mullite whiskers by:

(1) forming an intimate, anhydrous mixture of $AlF_3$ and $SiO_2$ powders in about a 12:13 molar ratio of $AlF_3$ to $SiO_2$;

(2) heating the mixture in an $SiF_4$ atmosphere at a temperature of from about 700° C. to about 950° C. to form barlike topaz; and (3) heating the barlike topaz in a $SiF_4$ atmosphere at a temperature of from about 1150° C. to about 1400° C. to produce mullite whiskers.

The mullite whiskers produced are useful for reinforcing ceramic and metal matrices.

BRIEF DESCRIPTION OF THE FIGURES

A more complete appreciation of the invention and many of its attendant advantages thereof will be readily appreciated as the same becomes better understood by reference to the following detailed description when considered in connection with the accompanying scanning electron microscope (SEM) pictures wherein.

DETAILED DESCRIPTION OF THE PREFERRED EMBODIMENT

The present process comprises two reaction steps: (1) the conversion of aluminum fluoride ($AlF_3$) and silica ($SiO_2$) powders into topaz [$Al_2(SiO_4)F_2$] barlike crystals and (2) the subsequent conversion of the topaz barlike crystals into needlelike crystalline mullite ($3Al_2O_3 \cdot 2SiO_2$) whiskers. It is critical for the formation of barlike topaz and the subsequent formation of needlelike mullite whiskers that both of these steps be performed under anhydrous conditions in a silicon fluoride ($SiF_4$) atmosphere. Anhydrous conditions include the absence of structural or crystal water in the $AlF_3$ and $SiO_2$ starting materials.

The use of a $SiF_4$ atmosphere in both the barlike topaz formation step and the subsequent mullite whisker formation step requires the use of a close system. Increasing the concentration of the $SiF_4$ appears to improve the process steps.

REACTION 1

$$2AlF_3 + 2SiO_2 \rightarrow Al_2(SiO_4)F_2 + SiF_4$$
$$\text{topaz}$$

REACTION 2

$$6[Al_2(SiO_4)F_2] + SiO_2 \rightarrow 2(3Al_2O_3 \cdot 2SiO_2) + 9SiF_4$$
$$\text{topaz} \qquad \qquad \text{mullite}$$

NET REACTION FOR PROCESS $$12AlF_3 + 13SiO_2 \rightarrow 2(3Al_2O_3 \cdot 2SiO_2) + 9SiF_4$$
$$\text{mullite}$$

Thus 12 moles of $AlF_3$ are reacted with 13 moles of $SiO_2$ to produce 2 moles of mullite. The starting materials are mixed in molar ratio of $AlF_3$ to $SiO_2$ of about 12:13 in order to minimize the presence of unreacted starting material in the final mullite whisker product.

The starting materials for the topaz production step are anhydrous powders of $AlF_3$ and fused $SiO_2$ which form an intimate mixture of loose powders. Commercially available $AlF_3$ (99.9+%) and fused $SiO_2$ (99.5+%) are preferably used. The particle size is not critical; but the particles are preferably 60 microns or less and more preferably 40 microns or less in size. The intimate (uniformly distributed) mixture of powders may be formed by mixing the $AlF_3$ and $SiO_2$ powders in ethanol and then drying the resulting mixture.

Conventional reaction temperatures and times may be used for this topaz production step. For instance temperatures in the range of from about 700° to about 900° C. and reaction times of from about 3 to about 10 hours work well.

Figure 1:
FIG. 1 illustrates the barlike topaz produced as an intermediate product according to the present process.

It is critical that this topaz production step occurs under a $SiF_4$ atmosphere and anhydrous conditions. FIG. 1 shows a scanning electron microscope (SEM) picture of barlike topaz which was produced from a loose, intimate (uniform) mixture of anhydrous $AlF_3$ and fused $SiO_2$ powders in a $SiF_4$ atmosphere. This was accomplished by heating the $AlF_3$ and $SiO_2$ mixture in a covered corundum crucible in a furnace. The reaction generated the $SiF_4$ gas as a byproduct. This barlike crystalline form of topaz is critical as the starting material for the mullite whisker formation step.

Figure 2:
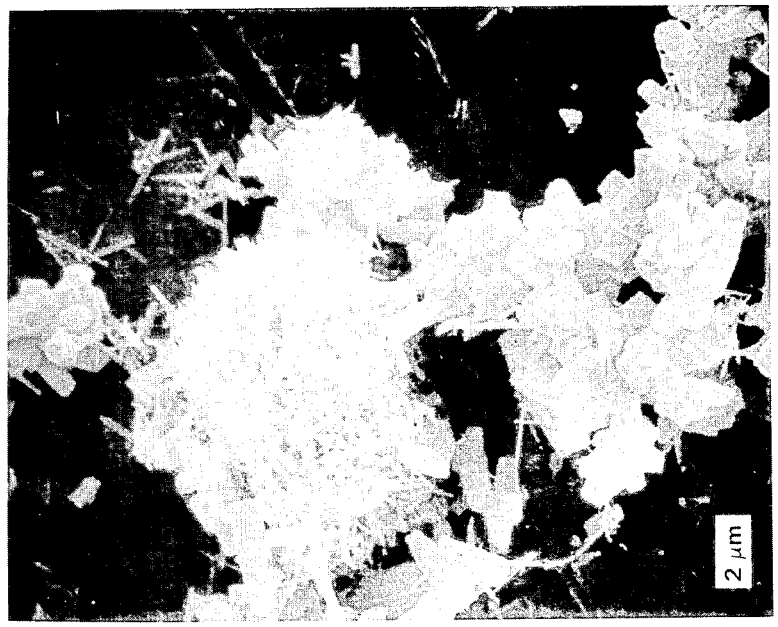
FIGS. 2 and 3 illustrate granular clumps of topaz produced when an oxidizing atmosphere or a $SiO_2$ gel (with chemically bonded water) is used in contrast to the present process.

By way of contrast, FIG. 2 shows a SEM picture of topaz produced from an identical loose, intimate mixture of $AlF_3$ and fused $SiO_2$ powders in an oxidizing atmosphere (an uncovered crucible in a furnace open to the atmosphere). The resulting topaz is in the form of granular clumps and is totally unsuitable for the mullite whisker production step. This difference in result demonstrates the criticality of performing the topaz production step in a $SiF_4$ atmosphere.

Figure 3:
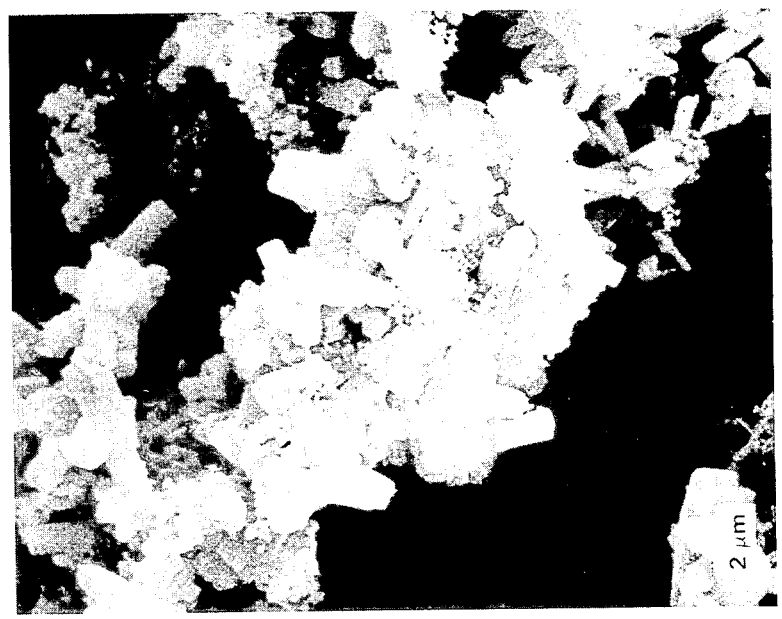

As is well known, $SiF_4$ decomposes upon contact with water into silicic acid and hydrogen fluoride; as a result, the presence of water interferes with the topaz production step. FIG. 3 shows a SEM picture of topaz produced in a $SiF_4$ atmosphere (covered crucible) from $AlF_3$ and silica ($SiO_2$) gel (water present). The topaz product is again in the form of granular clumps and is unsuitable for the mullite whisker production step. Moreover, as would be expected, the combination of oxidizing atmosphere (open crucible) and water (e.g., silica gel) produce a granular, clumpy, totally unsuitable form of topaz.

In the second step of the present process, the barlike topaz is converted into the mullite whiskers. It is critical that this step be performed in a $SiF_4$ atmosphere under anhydrous conditions. As illustrated by Example 6, if the conversion of barlike topaz to mullite is performed in an oxidizing atmosphere, barlike mullite is formed instead of the desired needlelike mullite whiskers. Note also that, it is critical that the topaz be in the barlike form of the product of first step (See FIG. 1). Topaz in other forms, such as the granular clumps shown in FIGS. 2 and 3, will not produce the desired mullite whisker product even in a $SiF_4$ atmosphere under anhydrous conditions.

The conversion of topaz needles into mullite whiskers is performed at a temperature of from about 1150° to about 1400° C., preferable at a temperature of from 1200° to 1300° C., and more preferably at a temperature of 1250° C. The materials are heated at the temperature for from 3 to 10 hours, preferably from 3 to 5 hours, and more preferably 4 hours.

These time and temperature ranges exceed that required to merely convert topaz to mullite. SEM pictures taken just after differential thermal analysis (DTA) has shown the conversion from topaz to mullite to be completed show that the mullite is still in the form of large barlike crystals. Further heating at higher temperatures in the $SiF_4$ atmosphere is required to cause the division of the large needles of mullite into smaller whiskers.

Figure 4:
FIGS. 4 through 8 illustrate the formation of needlelike mullite whiskers from the barlike topaz crystals according to the present process.
Figure 6:
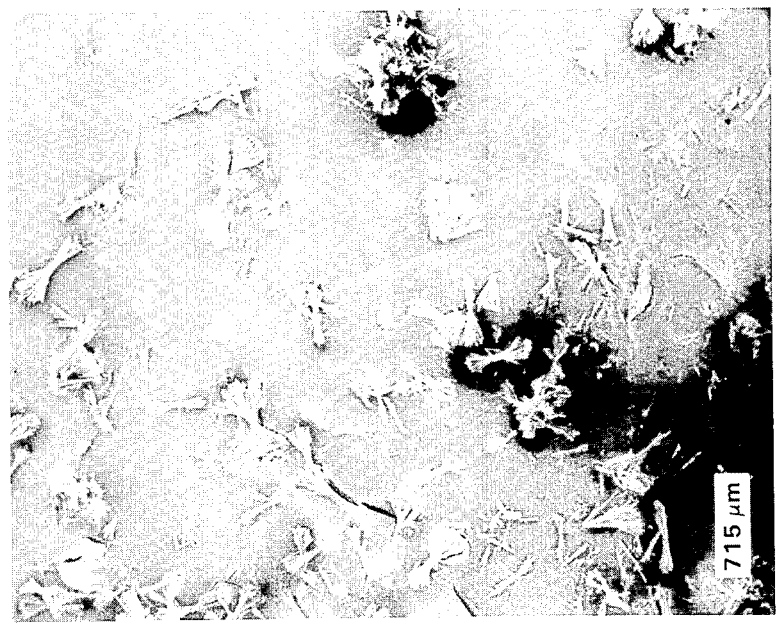
Figure 5:
Figure 8:
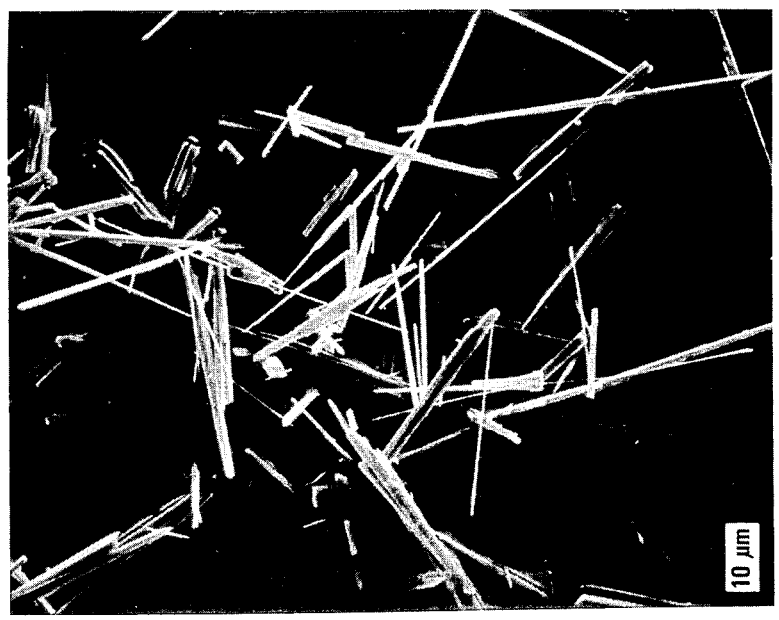
Figure 7:

The division of the mullite needles into whiskers begins at each end of the needle as illustrated (SEM) by FIGS. 4 and 5. The divisions at each end proceed to the midpoint of the needle as shown (SEM) by FIG. 6. It appears that upon further division a fracturing occurs at about the midpoint producing the desired separate mullite whiskers as shown in FIGS. 7 and 8.

At temperatures above the preferred temperature range and times well beyond the preferred time range for the mullite needle production step, the separate mullite whiskers may sinter together.

The described process can be carried out by a first firing to produce the barlike topaz and then a subsequent firing to produce the needlelike mullite whiskers. Or those two separate stages can be combined into a single firing with a hold at a temperature of about 700° to about 950° C. to produce needle-like topaz followed by a ramp to a temperature of about 1150° C. to about 1400° C. where the mullite whiskers are produced. The one-fire process is preferable because high-quality mullite whiskers can be obtained at 1150° C. as compared to 1250° C. for the two-fire process. The one-fire procedure is suitable for a continuous process on an industrial scale.

The final reaction product consists of loosely agglomerated mullite whiskers which can be easily separated in a conventional, chemically inert (to mullite), volatile suspension medium such as ethanol, toluene, or cyclohexane. After they are dried, the whiskers are ready for use in ceramic, metal, and other composite matrices.

The mullite whiskers produced by the present process have been shown to be chemically compatible with oxide ceramic matrices such as zircon ($ZrO_2.SiO_2$), mullite ($3Al_2O_3.2SiO_2$), alumina ($Al_2O_3$), and silica ($SiO_2$).

The general nature of the invention having been set forth the following examples are presented as specific illustrations thereof. It will be understood that the invention is not limited to these specific examples but is susceptible to various modifications that will be recognized by one of ordinary skill in the art.

EXAMPLE 1

A mixture of 1.47 g $AlF_3$ (Atomergic Chemetals Corp. 99.9%) and 1.06 g fused $SiO_2$ (Thermo Materials, 4.3 microns average, 99.5+%) were thoroughly mixed in ethanol and dried in a vacuum oven at 55°–60° C. The resulting mixture was ground with a corundum mortar and pestle and screened through a 40 micron sieve. The mixture was then placed into a 100 ml corundum crucible and covered with a corundum disc. The disc and lip of the crucible were sanded down to ensure a tight seal. The crucible with lid containing the mixture was heated in a furnace with a ramp of 8.6° C./min to 700° C. and held at this temperature for 3 hours for topaz formation an then ramped to 1250° C. at 1.5° C./min and held for 4 hours for mullite formation. The specimen was cooled naturally in the furnace and removed at room temperature. X-ray diffraction and scanning electron microscope (SEM) examinations showed the product to consist of needlelike mullite as shown in FIGS. 7 and 8.

EXAMPLE 2

A mixture of 1.75 g $AlF_3$ and 1.25 g fused $SiO_2$ powders were thoroughly mixed in ethanol and dried in a vacuum oven at 55°–60° C. The resulting mixture was ground with a corundum mortar and pestle and screened through a 40 micron sieve. The mixture was then placed into a corundum cruible and covered with a corundum disc. The disc and lip of the crucible were sanded down to ensure a tight seal. The crucible with lid containing the mixture was heated in a furnace with a ramp of 8.6° C./min to 700° C. and held at this temperature for 3 hours. The specimen was cooed naturally in the furnace and removed at room temperature. X-ray diffraction and SEM examinations showed the 1 product to consist of barlike topaz as shown in FIG. 1.

EXAMPLE 3

The topaz from Example 2 contained loosely aggregated clumps which were deaggregated using ultrasonic treatment in ethanol. The topaz was then dried in a vacuum oven at 55°-60° C. The topaz was then placed into a corundum crucible and covered with a corundum disc. The crucible with the lid containing the topaz was heated in a furnace with a ramp of 5° C./min then a ramp of 1.5° C./min up to 1250° C. and held at this temperature for 4 hours. The specimen was cooled naturally in the furnace and removed at room temperature. X-ray diffraction and SEM examinations showed the product to consist of mullite whiskers which are the same as those produced in example 1. The mullite whiskers consisted of loosely aggregated clumps which were deaggregated using ultrasonic treatment in ethanol. The mullite whiskers were then dried in a vacuum oven at 55°-60° C.

EXAMPLE 4

A mixture of 1.62 g $AlF_3$ and 1.16 fused $SiO_2$ was heated as in example 2 but the lid was left off and the material was exposed to an oxidizing atmosphere. X-ray diffraction and SEM examinations showed the product to consist of granular clumpy topaz as shown in FIG. 2.

EXAMPLE 5

A mixture of 0.79 g $AlF_3$ and 0.56 g $SiO_2$ gel instead of fused $SiO_2$ was used as starting materials. The $SiO_2$ gel was prepared using tetraethylorthosilicate (TEOS), (Stauffer Chemical Co., 40.3% $SiO_2$). The TEOS was diluted with ethanol in a 1:1 volume ratio. The solution was added to an aqueous $AlF_3$ suspension. Ammonium hydroxide ($NH_4OH$) was added dropwise while blending until the mixture thickened as a result of TEOS hydrolysis. The mixture was then dried in a vacuum oven at 55°-60° C. The powder was screened through a 40 micron sieve and fired as in example 2 ($SiF_4$ atmosphere) with ramp of 8.6° C./min to 800° C. and held at this temperature for 3 hours. X-ray diffraction and SEM examinations showed the product to consist of granular clumpy topaz as shown in FIG. 3.

EXAMPLE 6

The barlike topaz as prepared in example 2 was heated in a furnace with a ramp of 5° C./min to 700° C. and then ramped at 1.5° C./min to 1250° C. and held for 4 hours. During the firing, the lid was left off and the material was exposed to an oxidizing atmosphere. X-ray diffraction and SEM examinations showed the product to consist of mullite bars retaining the crystallinity of the original topaz bars .

Obviously numerous modifications and variations of the present invention are possible in light of the above teachings. It is therefore to be understood that within the scope of the appended claims the invention may be practiced otherwise than as specifically described herein.

What is claimed as new and desired to be secured by Letters Patent of the United States is:

1. A process for preparing mullite whiskers comprising the following steps in order:
    (1) forming a uniform, intimate, anhydrous mixture of $AlF_3$ and $SiO_2$ powders in a molar ratio of about 12:13 of $AlF_3$ to $SiO_2$;
    (2) heating the mixture under anhydrous conditions in a $SiF_4$ atmosphere at a temperature of from about 700° C. to about 950° C. to form barlike crystalline topaz; and
    (3) heating the barlike topaz under anhydrous conditions in a $SiF_4$ atmosphere at a temperature of about 1150° C. to about 1400° C. to produce needlelike mullite whiskers.
2. The process of claim 1 wherein the temperature used in step (3) is from 1200° C. to 1300° C.
3. The process of claim 2 wherein the temperature used in step (3) is about 1250° C.
4. The process of claim 1 wherein the $AlF_3$ powder and the $SiO_2$ powder each have particle sizes of less than 60 microns.
5. The process of claim 4 wherein the $AlF_3$ powder and the $SiO_2$ powder each have particle sizes of less than 40 microns.
6. A process for producing barlike crystalline topaz comprising:
    (1) forming an intimate, anhydrous mixture of $AlF_3$ and $SiO_2$ powders in a molar ratio of about 12:13 of $AlF_3$ to $SiO_2$; and
    (2) heating the mixture under anhydrous conditions in a $SiF_4$ atmosphere at a temperature of from about 700° C. to about 950° C. to form barlike crystalline topaz.
7. The process of claim 6 wherein the $AlF_3$ powder and the $SiO_2$ powder each have particle sizes of less than 60 microns.
8. The process of claim 7 wherein the $AlF_3$ powder and the $SiO_2$ powder each have particle sizes of less than 40 microns.
9. A process for converting barlike crystalline topaz into needlelike mullite whiskers comprising:
    heating the barlike crystalline topaz under anhydrous conditions in a $SiF_4$ atmosphere at a temperature of from about 1150° C. to about 1400° C. to produce needlelike mullite whiskers.
10. The process of claim 11 wherein the temperature is from 1200° C. to 1300° C.
11. The process of claim 10 wherein the temperatures is about 1250° C.

* * * * *